United States Patent [19]

Ueda

[11] Patent Number: 5,034,702
[45] Date of Patent: Jul. 23, 1991

[54] AMPLIFYING CIRCUIT INCLUDING A BIAS CIRCUIT FOR INDEPENDENTLY DETERMINING A DRAIN CURRENT AND A DRAIN VOLTAGE

[75] Inventor: Tomio Ueda, Sendai, Japan

[73] Assignee: Fujitsu Limited, Kawasaki, Japan

[21] Appl. No.: 480,068

[22] Filed: Feb. 14, 1990

[30] Foreign Application Priority Data

Feb. 15, 1989 [JP] Japan .................................. 1-035302

[51] Int. Cl.$^5$ ............................................. H03F 3/16
[52] U.S. Cl. ..................................... 330/277; 330/290; 330/296
[58] Field of Search ........................ 330/277, 296, 290

[56] References Cited

U.S. PATENT DOCUMENTS 4,096,444  6/1978  Fellrath ............................... 330/277
4,264,874  4/1981  Young ............................... 330/296 X Primary Examiner—James B. Mullins
Attorney, Agent, or Firm—Staas & Halsey

[57] ABSTRACT

Disclosed is an amplifying circuit comprising an amplifying transistor for amplifying an input signal, and a bias circuit for determining a current passing through the amplifying transistor and for determining an output voltage at the output of the amplifying transistor. The bias circuit comprising a current determining transistor for determining a current conducting through the amplifying transistor and a voltage determining transistor for determining an output voltage at the output of the amplifying transistor. The output voltage is determined independently from the determination of the current.

9 Claims, 4 Drawing Sheets

AMPLIFYING CIRCUIT INCLUDING A BIAS CIRCUIT FOR INDEPENDENTLY DETERMINING A DRAIN CURRENT AND A DRAIN VOLTAGE

BACKGROUND OF THE INVENTION

1. Field of the Invention

The present invention relates to an amplifying circuit including a bias circuit, and more particularly, to bias circuits for making the characteristics of a plurality of amplifying transistors coincide.

In the case of a balanced amplifier in which an input is divided into two branches which are respectively amplified by amplifying transistors such as field effect transistors (herein after referred to as FETs), and the outputs thereof are combined to obtain a desired output, or in the case of supervising an input level of a mixer by dividing the output of the balanced amplifier into two branches, one of which is input into the mixer for effecting a frequency conversion and the other of which is measured, it is necessary to coincide the output power of the two FETs. The adjustment for this is effected by setting the drain voltages $V_{DS}$ and the drain currents $I_D$ of the FETs.

To achieve this effect, a bias circuit is desired in which the drain currents $I_D$ can be kept constant and the drain voltages $V_{DS}$ can be changed independently from the drain currents $I_D$, and the number of adjusting points is kept as small as possible.

2. Description of the Related Art

In a conventional balanced amplifier, the drain current and the drain voltage of each FET are respectively adjusted by variable resistors, however, there are problems in that a large number of expensive variable resistors are necessary and the adjustment of the drain currents is troublesome, as later described in more detail with reference to the drawings.

In another conventional balanced amplifier, the drain current and the drain voltage of each FET are automatically determined by employing a bias transistor. In this case, however, the drain voltage cannot be determined independently from the determination of the drain current, as later described in more detail with reference to the drawings.

SUMMARY OF THE INVENTION

Accordingly, an object of the present invention is to provide an amplifying circuit with a bias circuit which can determine the drain voltage independently from the determination of the drain current while the drain current is kept constant, with a small number of adjusting points and at a low cost.

To attain the above object, there is provided, according to the present invention, an amplifying circuit comprising at least one amplifying transistor for amplifying an input signal, and at least one bias circuit for determining a current passing through the amplifying transistor and for determining an output voltage at the output of the amplifying transistor. The bias circuit comprises a current determining circuit including a current determining transistor, connected to the amplifying transistor, for determining a current passing through the amplifying transistor, and a voltage determining circuit including a voltage determining transistor, connected to the amplifying transistor, for determining an output voltage at the output of the amplifying transistor, the output voltage being determined independently from the determination of the current.

By the current determining transistor, the current passing through the amplifying transistor is determined. By the voltage determining transistor, the output voltage of the amplifying transistor is determined independently from the current passing through the amplifying transistor.

BRIEF DESCRIPTION OF THE DRAWINGS

The above object and the features of the present invention will be more apparent from the following description of the preferred embodiments with reference to the drawings, wherein.

DESCRIPTION OF THE PREFERRED EMBODIMENTS

For better understanding of the present invention, conventional amplifier circuits and the problems therein will first be described with reference to FIGS. 1A, 1B, 1C and 2.

Figure 1A:
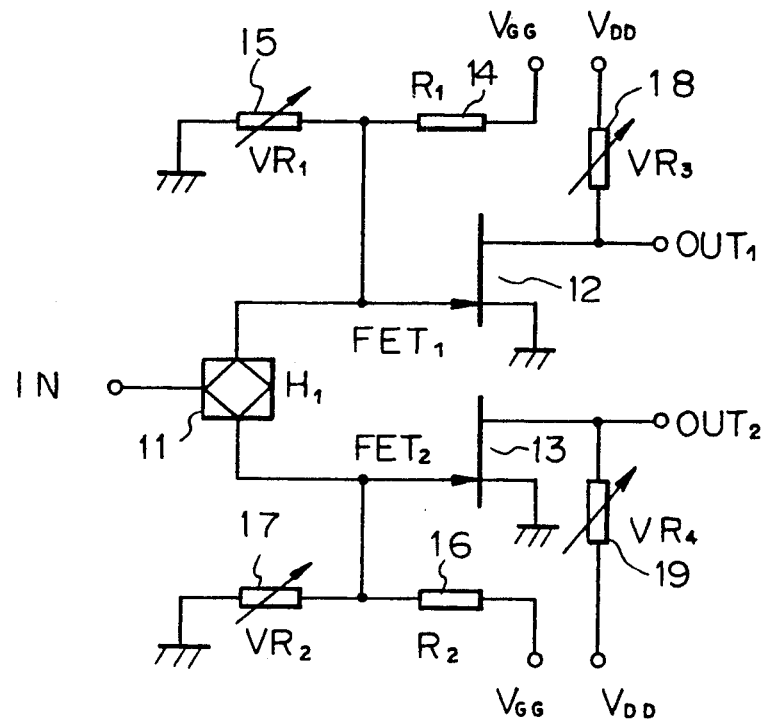
FIG. 1A is a circuit diagram showing an example of a conventional amplifier circuit including two amplifying FETs and two bias circuits.
Figure 1B:
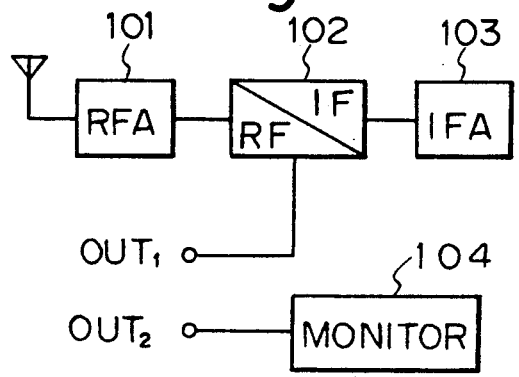
FIG. 1B is a block diagram showing a mixer and a monitor to which the outputs of the amplifier circuit shown in FIG. 1A are applied.
Figure 1C:
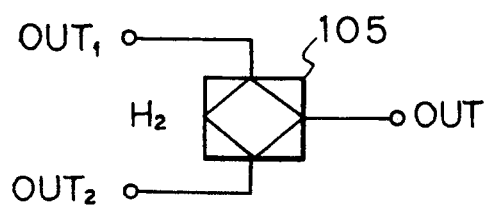
FIG. 1C is a block diagram showing a hybrid circuit for combining the outputs of the amplifier circuit when the amplifier is used as a balanced amplifier.

FIG. 1A is an example of the construction of a balanced amplifier. In the FIGURE, a high frequency input signal applied to an input terminal IN is divided by a hybrid circuit ($H_1$) 11 into two branches which are amplified by two amplifying transistors ($FET_1$ and $FET_2$) 12 and 13. As an application of the balanced amplifier, one of the outputs at the output terminals $OUT_1$ and $OUT_2$ may be applied as an input signal of a mixer (RF/IF) 102 in a heterodyne receiver having a radio frequency amplifier (RFA) 101, the mixer (RF/IF) 102 for converting the radio frequency into an intermediate frequency, an intermediate frequency amplifier (IFA) 103, and the other output at the output terminal $OUT_2$ being monitored by a monitoring unit 104, as shown in FIG. 1B. As an another application of the balanced amplifier, the output signals at the output terminals $OUT_1$ and $OUT_2$ are combined by a hybrid circuit ($H_2$) 105, as shown in FIG. 1C, to obtain a desired output signal.

Referring back to FIG. 1A, a resistor 14 having a resistance $R_1$ and a variable resistor 15 having a variable resistance $VR_1$ are connected in series between a power supply voltage $V_{GG}$ and ground. The gate voltage of the transistor 12 is determined by the resistors 14 and 15. Therefore, the gate voltage of the transistor 12 can be adjusted by adjusting the variable resistor 15. The drain current passing through the transistor 12 is determined by its gate voltage. Once the drain current $I_D$ is determined, the drain voltage $V_{DS}$ at the output terminal $OUT_1$ is determined by adjusting a variable resistor ($VR_3$) 18 connected between the power supply voltage $V_{DD}$ and the drain of the transistor 12. In this case, in bias setting circuits consisting of a resistor $R_1$ and a variable resistor $VR_1$, and a resistor $R_2$ and a variable resistor $VR_2$, the drain currents $I_D$ are respectively set to predetermined values by adjusting the gate voltages $V_{GS}$ by means of $VR_1$ and $VR_2$, and the drain voltages $V_{DS}$ are respectively set by adjusting the variable resistors $VR_3$ and $VR_4$ provided in the drain circuits.

Similarly, the drain current passing through the other transistor 13 can be determined by adjusting a variable resistor ($VR_2$) 17, and the drain voltage of the transistor 13 can be determined by adjusting a variable resistor ($VR_4$) 19.

In the circuit shown in FIG. 1A, there are various problems as follows.

(1) When one of the outputs is input into the local oscillator circuit and the other output is monitored as shown in FIG. 1B, or when the two outputs, are combined to obtain a desired output, the two output powers should be the same. In the circuit shown in FIG. 1A, the drain currents are set by adjusting the variable resistors 15 and 17 separately, and the drain voltages are set by adjusting the variable resistors 18 and 19 separately. In other words, the drain currents cannot be set by adjusting a single variable resistor. This is because the field effect transistors 12 and 13 do not always have the exact same characteristics due to variations in their manufacturing processes. Therefore, there are a number of adjusting points in the circuit shown in FIG. 1A. Further, it is necessary to measure the drain currents. Accordingly, the circuit shown in FIG. 1A has a disadvantage in that the adjustment and the measurement of the drain currents are troublesome.

(2) The circuit shown in FIG. 1A requires a number of variable resistors. Since variable resistors are expensive, it is not preferable to use a number of them.

(3) Even after the drain currents are set to a desired value by adjusting the variable resistors 15 an 16, when a high voltage signal is applied at the input terminal IN, a gate current $I_G$ flows due to a forward bias between the gate and the N channel so that the gate voltage $V_{GS}$ changes, and accordingly, the drain current $I_D$ changes. In particular, when the output signal of the amplifier shown in FIG. 1A is applied to the mixer 102, and output signal of a local oscillator (not shown) is applied to the input terminal IN of the amplifier shown in FIG. 1A, and, to make the output power level of the amplifier constant, the input level of the amplifier, which is the output level of the local oscillator, is often made so high that the output level of the amplifier is saturated. In this case, when the output level of the local oscillator fluctuates due to temperature changes and so forth, the gate current $I_G$ changes so that the gate voltage $V_{GS}$ changes, and accordingly the drain current $I_D$ changes. As a result, the fluctuation of the output level of the local oscillator is undesirably amplified.

Because of this, it has been desired to obtain a bias circuit in which the drain voltage $V_{DS}$ can be changed independently from the drain current $I_D$ while the drain current $I_D$ is kept constant.

Figure 2:
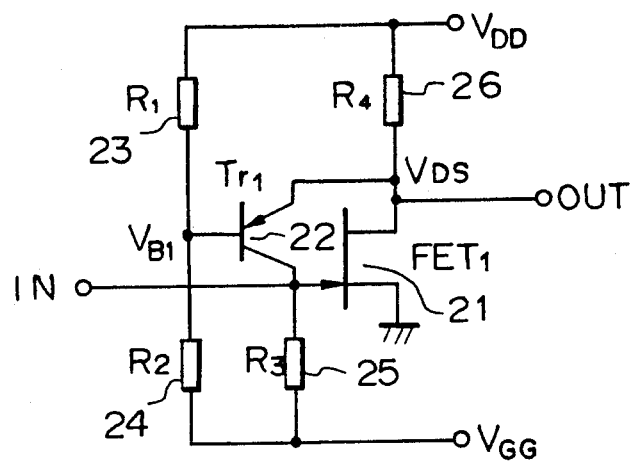
FIG. 2 is a circuit diagram showing another example of a conventional amplifier circuit including a bias circuit.

FIG. 2 is a circuit diagram showing another example of a conventional amplifier circuit including a bias circuit in which the gate voltage $V_{GS}$ is automatically adjusted so as to make the drain voltage $V_{DS}$ and the drain current $I_D$ constant. If two outputs are necessary as in the balanced amplifier shown in FIG. 1A, two circuits each being the same as the circuit shown in FIG. 2 may be provided.

In the circuit shown in FIG. 2, when the positive power supply voltage $V_{DD}$ and the negative power supply voltage $V_{GG}$ are constant, the drain voltage $V_{DS}$ of the amplifying transistor ($FET_1$) 21 is determined as:

$$V_{DS} = V_{B1} + 0.6 V$$

by applying a base voltage $V_{B1}$ determined by the ratio of resistors ($R_1$ and $R_2$) 23 and 24 connected in series between the power supply voltage $V_{DD}$ and the negative power supply voltage $V_{GG}$. The current passing through a resistor 26 having a resistance $R_4$ connected between the drain of the amplifying transistor 21 and the positive power supply voltage $V_{DD}$ is shunt through the field effect transistor ($FET_1$) 21 and a pnp transistor ($Tr_1$) 22, however, most of the current flows through the field effect transistor 21. Therefore, the drain current $I_D$ is determined by dividing the voltage between the positive power supply voltage $V_{DD}$ and the drain voltage $V_{DS}$, by the resistance $R_4$. In this case, the gate voltage $V_{GS}$ is automatically adjusted by the transistor $Tr_1$ in such a way that the drain voltage $V_{DS}$ becomes the above mentioned value. Namely, when the drain current $I_D$ is increased, the drain voltage $V_{DS}$ which is the same as the emitter voltage of the transistor 22 is lowered, so that the collector voltage of the transistor 22 and thus the gate voltage of the transistor 21 is lowered, resulting in a decrease of the drain current $I_D$ so that the drain voltage $V_{DS}$ is raised.

In the circuit shown in FIG. 2, the drain voltage $V_{DS}$ is set by the ratio between the resistors $R_1$ and $R_2$, and the drain current $I_D$ changes when $V_{DS}$ changes. Namely, once the drain voltage $V_{DS}$ is determined, the drain current $I_D$ can be set independently from the drain voltage $V_{DS}$ by changing the resistance $R_4$.

However, if the drain voltage $V_{DS}$ changes, the drain current $I_D$ also changes. In other words, in the circuit shown in FIG. 2, the drain voltage $V_{DS}$ cannot be changed while the drain current $I_D$ is kept constant. When the output of the amplifier shown in FIG. 2 is applied to the input of the mixer 102 shown in FIG. 1B, it is often necessary to independently change the drain voltage $V_{DS}$ while the drain current $I_D$ is kept constant. Therefore, the amplifier shown in FIG. 2 cannot be applied as an input circuit of the mixer 102.

Figure 3:
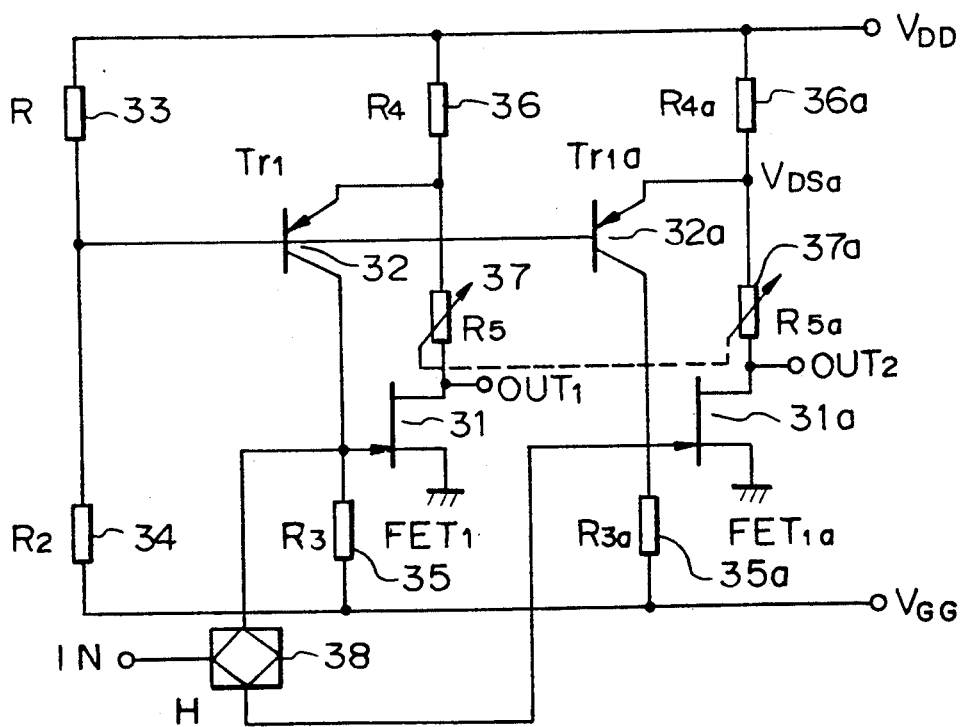
FIG. 3 is a circuit diagram showing an example of an amplifier circuit employing variable resistors in the bias circuits, considered before conceiving the present invention.

FIG. 3 is a circuit diagram showing an example of an amplifier circuit employing tandem type variable resistors in the bias circuits, considered before conceiving the present invention, in which amplifying transistors ($FET_1$ and $FET_{1a}$) 31 and 31a are field effect transistors intended to have the same characteristics, transistors ($Tr_1$ and $Tr_{1a}$) 32 and 32a are bipolar transistors, 33 to 36 are resistors having resistances $R_1$ to $R_4$, 35a and 36a are resistors having resistances $R_{3a}$ and $R_{4a}$. 37 and 37a are tandem type variable resistors having resistances $R_5$ and $R_{5a}$ which are the same.

In the circuit shown in FIG. 3, since the tandem type variable resistors 37 and 37a are inserted in the drain circuits of the amplifying transistors (FET$_1$ and FET$_{1a}$) 31 and 31a, the drain voltages can be changed independently from the respective drain currents by adjusting the resistors 37 and 37a. Namely, the base voltage of the transistors 32 and 32a is determined by the resistors 33 and 34 connected between the power supply voltage V$_{DD}$ and the negative power supply voltage V$_{GG}$. The emitter voltage of the transistor 32 is determined by the base voltage plus the emitter-base voltage which is constant and approximately 0.6V. Thus, the drain current passing through the transistor 31 is determined by dividing the voltage between the emitter of the transistor 32 and the power supply voltage V$_{DD}$ by the resistance R$_4$ of the resistor 36. The drain voltage of the transistor (FET$_1$) 31 is then determined by adjusting the variable resistor 37. Similarly the drain voltage of the transistor 31a is determined by adjusting the variable resistor 37a.

Therefore, in the circuit shown in FIG. 3, the output voltage at the output terminal OUT$_1$ or OUT$_2$ can be changed independently from the drain current I$_D$, and the drain current I$_D$ can be changed independently from the output voltage. However, there is a problem in that an increase in the cost cannot be avoided because two variable resistors of the tandem type are necessary when applied to a balanced amplifier and so forth, and the respective variable resistors must be adjusted so that the drain voltages of both the FETs are coincident, thus requiring tandem type variable resistors having the same characteristics.

In the present invention, such problems in the conventional arts are intended to be solved, and the present invention has an object to provide a bias circuit in which a drain voltage V$_{DS}$ can be set independently while the drain current I$_D$ of the FET is kept constant, and which has a small number of adjusting points so that it can be constructed at a low cost.

Figure 4:
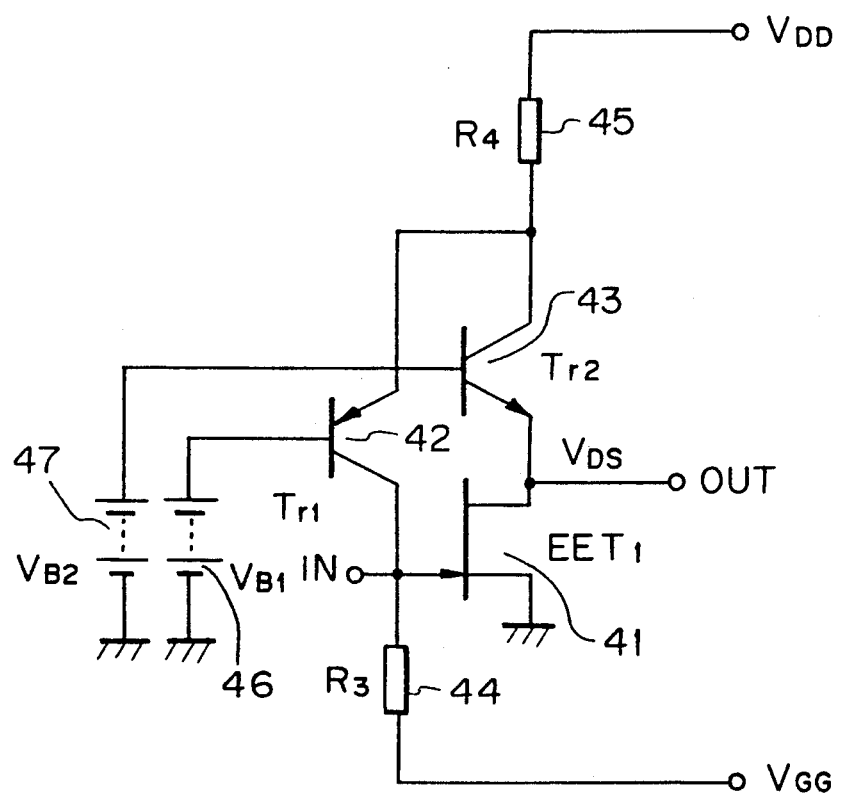
FIG. 4 is a circuit diagram showing an amplifier circuit including a bias circuit according to an embodiment of the present invention.

The principle construction of an embodiment of the present invention is as shown in FIG. 4, in which an amplifying transistor (FET$_1$) 41 is an N channel field effect transistor (FET) of a junction type, a pnp transistor (Tr$_1$) 42 is a drain current determining transistor, and an npn transistor (Tr$_2$) 43 is a drain voltage determining transistor. The drain current determining transistor 42 has a base connected to receive a first bias voltage V$_{B1}$ from a first bias voltage source 46, an emitter connected through a drain current determining resistor 45 having a resistance R$_4$ to a positive power supply voltage V$_{DD}$, and a collector connected to the gate electrode of the amplifying transistor 41. The drain voltage determining transistor 43 has a base connected to receive a second bias voltage V$_{B2}$ from a second bias voltage source 47, a collector connected through the resistor 45 to the power supply voltage V$_{DD}$, and an emitter connected to the drain of the amplifying transistor 41. The gate electrode of the amplifying transistor 41 is connected to an input terminal IN. The drain of the amplifying transistor 41 is connected to an output terminal OUT. The source electrode of the amplifying transistor 41 is connected to ground. The gate electrode of the amplifying transistor 41 is connected through a resistor 44 to a negative power supply voltage V$_{GG}$.

The second bias voltage V$_{B2}$ should be lower than the power supply voltage V$_{DD}$. The first bias voltage V$_{B1}$ plus the emitter-base voltage of the transistor 42 should be lower than the second bias voltage V$_{B2}$.

In operation, the drain current of the amplifying transistor 41 is set by adjusting the base voltage of the transistor Tr$_1$. Namely, the emitter voltage of the transistor 42 is determined as V$_{B1}$ plus emitter-base voltage of the transistor 42, and the current passing through the resistor 45 is determined by dividing the voltage between V$_{DD}$ and the emitter voltage of the transistor 42 by the resistance R$_4$. The drain voltage of the amplifying transistor 41 is set by adjusting the base voltage of the transistor Tr$_2$. Namely, the drain voltage can be determined as the voltage V$_{B2}$ minus the base-emitter voltage of the transistor 43, independent from the determination of the drain current.

Figure 5A:
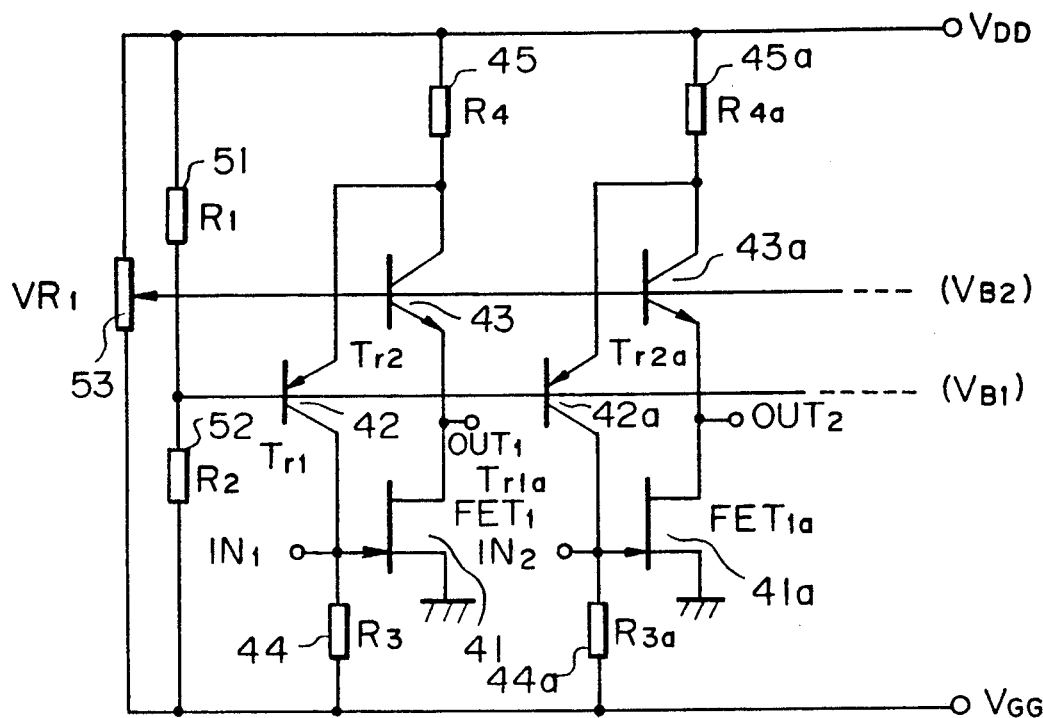
FIGS. 5A and 5B are circuit diagrams showing an amplifier circuit according to an embodiment of the present invention.

FIGS. 5A is a circuit diagram of a balanced amplifier according to an embodiment of the present invention. In FIG. 5A, the same reference numerals as those in FIG. 4 represent the same parts. Similar parts as the parts 41 to 45 are respectively represented by symbols 41a to 44a. There are two amplifying circuits, one being formed by the parts 41 to 45 and the other being formed by the parts 41a to 45a. A resistor 51 having a resistance R$_1$ and a resistor 52 having a resistance R$_2$ are connected in series between the positive power supply voltage V$_{DD}$ and the negative power supply voltage V$_{GG}$. The connecting point of the resistors 51 and 52 is commonly connected to the bases of the transistors 42 and 42a. By this arrangement, the first bias voltage V$_{B1}$ in FIG. 4 is realized in FIG. 5A. A variable resistor 53 having a variable resistance VR$_1$ is connected between the positive power supply voltage V$_{DD}$ and the negative power supply voltage V$_{GG}$. The intermediate point of the variable resistor 53 is commonly connected to the bases of the transistors 43 and 43a. By this arrangement, the second bias voltage V$_{B2}$ in FIG. 4 is realized in FIG. 5A.

The gate electrode of the amplifying transistor 42 is connected to a first input terminal IN$_1$. The gate electrode of the amplifying transistor 43 is connected to a second input terminal IN$_2$. The drain of the amplifying transistor 41 is connected to a first output terminal OUT$_1$, and the drain of the amplifying transistor 41a is connected to a second output terminal OUT$_2$.

Figure 5B:
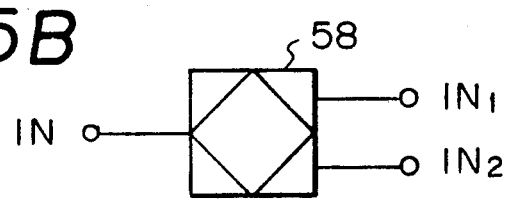
Figure 5C:
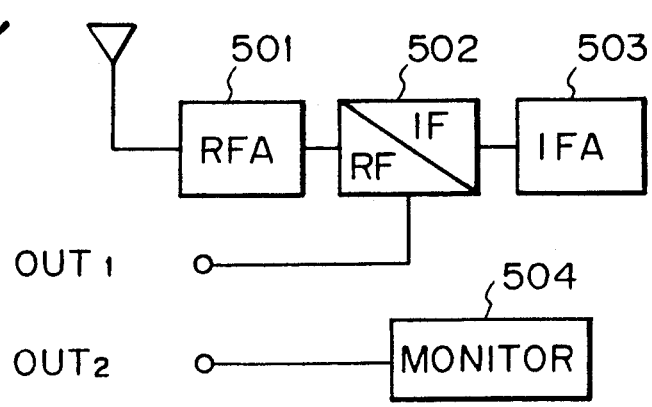
FIG. 5C is a block diagram of a mixer and a monitoring circuit to which the outputs of the amplifier circuit are applied according to the embodiment of the present invention.

When the amplifying circuit shown in FIG. 5A is used as a balanced amplifier, an input signal from an oscillator circuit (not shown) and applied to an input terminal IN is divided into two branches by a hybrid circuit 58 as shown in FIG. 5B, and the two outputs thereof are applied as the input signals to the input terminals IN$_1$ and IN$_2$. One of the two output signals output from the output terminal OUT$_1$ may be applied as a local oscillator input to a mixer 502 connected between a radio frequency amplifier 501 and an intermediate frequency amplifier 503, and the other output signal may be monitored by a monitoring unit 504 as shown in FIG. 5C.

In the circuit shown in FIG. 5A, by the circuit including the transistors 41 and 41a, and the resistors 44, 45, 51, and 52, the gate voltage of the amplifying transistors 41 and 41a are automatically adjusted so as to make their drain currents constant. Also, the drain voltages are arbitrarily set by adjusting the variable resistor 53.

Accordingly, by the circuit of FIG. 5A, the respective drain voltages can be changed simultaneously and with a good balance by adjusting the variable resistor 53 while the drain currents of the amplifying transistors 41 and 41a are kept constant.

Any number of the amplifying field effect transistors which should have the same characteristics as those of the field effect transistor 41 may be provided according to the present invention.

Note that, in the circuit of FIG. 5A, instead of the N channel FETs, P channel FETs may alternatively be used. Further, the polarities of the npn and pnp bipolar transistors may be reversed with the reverse of the polarities of the power supply voltages. Namely, each transistor may be changed to npn type or pnp type, and in this case the polarities of the power supplies may also be changed.

Also, as the amplifying transistor 41 and 41a, not only the junction type field effect transistors, but also MOS FETs or bipolar transistors may be used. In this case, the power supply $V_{GG}$ is not restricted to the negative power supply but may be ground for example.

Also, when it is used in a balanced amplifier, a mixer and so forth, it is a matter of course that necessary high frequency circuits are connected to the gate sides and the drain sides of respective FETs, although they are omitted in FIG. 5A.

As described above, according to the present invention, in a bias circuit in which the gate voltages are automatically adjusted in such a way that the drain currents of a plurality of FETs become a designated value, since drain voltage determining transistors are provided in series with the drain circuits of the FETs, the drain voltages of the respective FETs can be adjusted simultaneously with a good balance by means of only one variable resistor while maintaining the drain currents to be constant, so that the adjustment is easy and the device is economical.

I claim:

1. An amplifying circuit comprising:
   at least one amplifying transistor having a control electrode connected to an input terminal, a first electrode connected to an output terminal, and a second electrode connected to ground for amplifying an input signal applied to said control electrode; and
   at least one bias circuit for determining a current passing through said amplifying transistor and for determining an output voltage at the output terminal of said amplifying transistor; said at least one bias circuit comprising:
      a current determining circuit including a current determining transistor having a first electrode connected through a first resistor to a power supply voltage, a control electrode connected to receive a first bias voltage lower than said power supply voltage, and a second electrode connected to said control electrode of said at least one amplifying transistor, for determining a current passing through said at least one amplifying transistor; and
      a voltage determining circuit including a voltage determining transistor having a control electrode connected to receive a second bias voltage lower than said first bias voltage, a first electrode connected to said first electrode of said current determining transistor, and a second electrode connected to said first electrode of said at least one amplifying transistor, for determining an output voltage at said output terminal, said voltage determining transistor having a polarity opposite that of said current determining transistor, said output voltage being determined independently from the determination of said current.

2. An amplifying circuit as claimed in claim 1, wherein said amplifying transistor comprises a field effect transistor having a gate electrode connected to the input terminal, a drain electrode connected to the output terminal, and a source electrode connected to the ground, for amplifying an input signal applied to said gate electrode.

3. An amplifying circuit as claimed in claim 2,
   wherein said current determining transistor is a bipolar transistor having an emitter connected through said first resistor to a positive power supply voltage included in the power supply voltage, a base connected to receive the first bias voltage lower than said positive power supply voltage, and a collector connected to said gate electrode of said at least one amplifying transistor; and
   wherein said voltage determining transistor comprises a bipolar transistor having an emitter connected to said drain electrode of said field effect transistor, a collector connected to said emitter of said current determining transistor, and a base connected to receive the second bias voltage lower than said first bias voltage.

4. An amplifying circuit as claimed in claim 3, wherein said collector of said current determining transistor is connected through a second resistor to receive a negative power supply voltage.

5. An amplifying circuit as claimed in claim 4, wherein said first bias voltage is determined by dividing a voltage between said positive power supply voltage and said negative power supply voltage by a first bias resistor and a second bias resistor.

6. An amplifying circuit as claimed in claim 5, wherein said second bias voltage is determined by a variable resistor connected between said positive power supply voltage and said negative power supply voltage.

7. An amplifying circuit as claimed in claim 6, wherein the emitter voltage of said current determining transistor is fixed by said first bias voltage plus the base-emitter voltage of said current determining transistor.

8. An amplifying circuit as claimed in claim 7, wherein said current conducting through said amplifying transistor is determined by dividing the voltage between said positive power supply voltage and said emitter voltage of said current determining transistor by the resistance of said first resistor.

9. An amplifying circuit comprising:
   at least one amplifying transistor comprising a field effect transistor having a gate electrode connected to an input terminal, a drain electrode connected to an output terminal, and a source electrode connected to ground, for amplifying an input signal applied to said gate electrode; and
   at least one bias circuit for determining a current passing through said amplifying transistor and for determining an output voltage at the output terminal of said amplifying transistor; said at least one bias circuit comprising:
      a current determining circuit including a current determining transistor comprising a bipolar transistor having an emitter connected through a first resistor to a positive power supply voltage, a base connected to receive a first bias voltage lower than said positive power supply voltage, and a collector connected to said gate electrode of said amplifying transistor, for determining a current passing through said at least one amplifying transistor; and a voltage determining circuit including a voltage determining transistor comprising a bipolar transistor having an emitter connected to said drain electrode of said field effect transistor, a collector connected to said emitter of said current determining transistor, and a base connected to receive a second bias voltage lower than said first bias voltage, for determining an output voltage at the output terminal of said amplifying transistor, said output voltage being determined independently from the determination of said current, said voltage determining transistor having a polarity opposite that of said current transistor.

* * * * *